US006940014B1

(12) United States Patent
Smith et al.

(10) Patent No.: US 6,940,014 B1
(45) Date of Patent: Sep. 6, 2005

(54) MODULAR ELECTRONIC EQUIPMENT ENCLOSURE COMPRISING SEALED CABLE INTERFACE MODULE

(75) Inventors: Kevan Smith, Overland Park, KS (US); Hans Marosfalvy, Lenexa, KS (US); Randall D. Hutchison, Shawnee, KS (US); Robert Schiffbauer, Olathe, KS (US)

(73) Assignee: Special Product Company, Overland Park, KS (US)

( * ) Notice: Subject to any disclaimer, the term of this patent is extended or adjusted under 35 U.S.C. 154(b) by 247 days.

(21) Appl. No.: 09/916,521

(22) Filed: Jul. 27, 2001

Related U.S. Application Data (60) Provisional application No. 60/221,234, filed on Jul. 27, 2000.

(51) Int. Cl.[7] .......................... H01L 23/28; H05K 5/06
(52) U.S. Cl. ..................... 174/52.2; 361/809; 174/52.1
(58) Field of Search ............................. 174/52.2, 52.4, 174/52.1, 60, 52.3; 257/787, 788; 361/809

(56) References Cited

U.S. PATENT DOCUMENTS

| | | | |
|---|---|---|---|
| 4,195,201 A | * | 3/1980 | Gryl, Jr. et al. ............... 178/46 |
| 4,229,616 A | * | 10/1980 | Hotchkiss ............... 174/138 F |
| 4,424,553 A | * | 1/1984 | Marsocci et al. ........... 361/825 |
| 4,449,576 A | | 5/1984 | Baum et al. |
| 4,465,899 A | | 8/1984 | Mauclere et al. |
| 4,528,615 A | | 7/1985 | Perry |
| 4,679,250 A | | 7/1987 | Davis et al. |
| 4,858,068 A | | 8/1989 | Bitller et al. |
| 4,962,445 A | | 10/1990 | Pelet et al. |
| 5,060,115 A | | 10/1991 | Sewell |
| 5,105,337 A | | 4/1992 | Bitller et al. |
| 5,251,099 A | | 10/1993 | Goss et al. |
| 5,329,425 A | | 7/1994 | Leyssens et al. |
| 5,343,358 A | | 8/1994 | Hilbrink |
| 5,777,846 A | | 7/1998 | Hayes et al. |
| 5,842,514 A | | 12/1998 | Zapach et al. |
| 5,844,777 A | | 12/1998 | Gates |

(Continued)

FOREIGN PATENT DOCUMENTS

| | | | |
|---|---|---|---|
| GB | 2193552 | 2/1988 | ............ H04B 9/00 |

(Continued)

OTHER PUBLICATIONS

Thermacore Inc. sales brochure, "heat pipes for electronics cooling applications", 4 page.

(Continued)

Primary Examiner—Hung V. Ngo
(74) Attorney, Agent, or Firm—Hovey Williams LLP (57) ABSTRACT

A modular electronic equipment enclosure (10) for housing telecommunications, signaling, or other electronic equipment. The enclosure (10) separates into modules for easier module-by-module installation. The preferred enclosure (10) broadly comprises three separable modules, including a housing module (12); a mounting structure (14); and a cable interface module (16). The housing module (12) receives, retains, and protectively encloses the electronic equipment. The mounting structure (14) is operable to secure to a mounting surface and to provide the housing module (12) with an operating orientation which is either perpendicular or parallel to the mounting surface. The interface block (16) is coupled with the housing module (12) in any of two or more possible orientations. The interface block (16) including a first wire connector half (94) operable to couple with a corresponding second wire connector half (38) connected to the electronic equipment.

16 Claims, 6 Drawing Sheets

U.S. PATENT DOCUMENTS

| | | |
|---|---|---|
| 5,883,784 A | 3/1999 | Hughes et al. |
| 5,896,268 A | 4/1999 | Beavers |
| 5,930,113 A | 7/1999 | McCann |
| 5,943,219 A | 8/1999 | Bellino et al. |
| 5,949,650 A | 9/1999 | Bulante et al. |
| 6,025,991 A | 2/2000 | Saito |
| 6,028,769 A | 2/2000 | Zurek |
| 6,046,908 A | 4/2000 | Feng |
| 6,055,157 A | 4/2000 | Bartilson |
| 6,104,611 A | 8/2000 | Glover et al. |
| 6,244,332 B1 | 6/2001 | Gesklin et al. |
| 6,252,775 B1 | 6/2001 | Kuroda |
| 6,292,556 B1 | 9/2001 | Laetsch |
| 6,504,379 B1 * | 1/2003 | Jackson ................. 324/539 |

FOREIGN PATENT DOCUMENTS

| | | | |
|---|---|---|---|
| JP | 57102058 | 6/1982 | ............ H01L 23/34 |
| JP | 6079834 | 6/1985 | ............ H04B 3/02 |
| JP | 865868 | 3/1996 | ............ H02G 9/02 |

OTHER PUBLICATIONS

Thermacore Inc. Product Data Guide, "Miniature Heat Pipes," Sep. 24, 1996, 1 page.

Thermacore Inc., "Common Question About Heath Pipes," Sep. 23, 1996, 2 pages.

Thermacore Inc. sales brochure, "The Leader in Heath Pipe Technology", 4 pages.

* cited by examiner

MODULAR ELECTRONIC EQUIPMENT ENCLOSURE COMPRISING SEALED CABLE INTERFACE MODULE

RELATED APPLICATIONS

This application claims priority benefit, with regard to all common subject matter, of a provisional application titled "Segmented Telecommunications Enclosure", Ser. No. 60/221,234, filed Jul. 27, 2000, which is hereby incorporated into the present application by reference.

BACKGROUND OF THE INVENTION

1. Field of the Invention

The present invention relates to electronic equipment enclosures and interfaces for interfacing the enclosures with cable assemblies. More particularly, the present invention provides a modular electronic equipment enclosure for housing telecommunications, signaling, or other electronic equipment, including, for example, repeater and doubler cards, wherein the modular enclosure comprises a sealed cable interface module for separably interfacing the enclosure with a cable assembly.

2. Description of the Prior Art

It is often necessary to house telecommunications, signaling, and other electronic equipment in protective enclosures so that the equipment may be located where needed, often being mounted on telephone poles or within subterranean manholes. For example, ever-increasing use of wide area networks (WANs), particularly the Internet, and other telecommunication innovations has increased demand for high-speed, high-bandwidth digital telecommunications services, such as ISDN, (X)DSL, and T1, in homes and businesses. Due to signal propagation limitations, these digital services require special electronic equipment, including repeaters and doublers, to repeat signals when end users are too far from a provider's central office.

Recently developed telecommunications equipment enclosures are designed to hold large numbers of repeaters or doublers, and have sophisticated passive heat dissipation features. Unfortunately, these enclosures and their raise or lower, position, and install, particularly in the tight confines of a manhole, potentially resulting in worker injury or damage to the enclosure. It is common for technicians to hard-wire a cable tail to the enclosure and use the cable tail to lower the heavy, fully-loaded enclosure into a manhole. It will be appreciated that this places a great deal of stress on the cable and often breaks or otherwise damages one or more seals on the enclosure. After the enclosure has been lowered into the hole, it must be positioned against a wall or rack and then held in place while being bolted or otherwise secured thereto, which is difficult given the weight and size of the enclosure.

Adding to the difficulty of installation is a very stiff and substantially inflexible cable assembly which must be interfaced with the enclosure to deliver and return electronic signals and to provide pressurized air. The cable assembly is typically hard-wired to the enclosure, making it labor-intensive to interface. Furthermore, hard-wiring makes the cable assembly and enclosure difficult to separate when desired, such as, for example, when removing, changing, or upgrading the enclosure of the housed electronic equipment. Additionally, limited space available in most mounting locations can exacerbate installation problems by preventing positioning of the enclosure so as to affect the best orientation for receiving and interfacing with the cable assembly.

Similar problems are encountered when installing and maintaining other electronic equipment enclosures, including signaling equipment enclosures, such are used, for example, in controlling traffic signals.

Due to the above-identified and other limitations of the current art, a need exists for an improved electronic equipment enclosure.

SUMMARY OF THE INVENTION

The present invention solves the above-described and other problems and provides a distinct advance in the art of enclosures for telecommunications, signaling, and similar electronic equipment. More particularly, the present invention provides a modular electronic equipment enclosure comprising a sealed cable interface module for separably interfacing a cable assembly with the enclosure. The enclosure separates into modules for easier installation; thus, rather than raising or lowering, positioning, and mounting an entire equipment-loaded enclosure and attached cable as a unit, the present invention allows for module-by-module installation, beginning with a mounting structure. Such modularity advantageously reduces or eliminates many of the above-described problems associated with installation, including, for example, technician injuries and equipment damage related to moving heavy fully-assembled enclosures.

Furthermore, where a first technician or crew is used to splice the cable assembly into a trunk like, and a second technician or crew is used to mount the enclosure, the present invention's advantageously modular design and separable cable interface and enclosure allows for phased installation whereby either technician or crew may perform their task substantially in advance of the other. This is a distinct improvement over non-modular prior art designs that typically required both tasks be performed substantially simultaneously.

The preferred modular enclosure broadly comprises three separable modules, including a housing module; the mounting structure; and a cable interface module. The housing module includes first and second body portions for protectively housing the telecommunications, signaling, or other electronic equipment. The mounting structure secures to the housing module and is adaptable for mounting in either vertical or horizontal orientations. The mounting structure also includes a strain relief yoke operable to provide additional support and strain relief to a connected cable assembly.

The cable interface module is separably coupled with the housing module and provides a wire bundle ending in quick connect/disconnect wire connectors operable to interface the enclosure and the equipment therein with the cable assembly. Replacing conventional hardwiring with the quick connect/disconnect wire connectors results in less labor intensive installation and removal of the enclosure during replacement, maintenance, and repair. The orientation of the interface module is changeable relative to the other modules of the enclosure. This advantageously allows the cable exiting the enclosure to be positioned facing the most convenient direction, such as, for example, in closest alignment with the trunk cable assembly.

In use, the modular electronic equipment enclosure may be installed and assembled module-by-module, beginning with the mounting structure. The present invention is not concerned with the order of reassembly which may depend upon a number of factors, including, for example, the installation environment and the number of enclosures to be installed. In some situations it may be desirable to involve a number of technicians, each equipped and trained to perform a different step in the installation process, wherein a first technician mounts one or more of the mounting structures; at some time thereafter a second technician couples the housing to the mounted mounting structure, and couples the interface module with the housing; and at some later time a third technician attaches the cable assembly to the main trunk line and tests the interface.

These and other features of the present invention are more fully described below in the section entitled DETAILED DESCRIPTION OF A PREFERRED EMBODIMENT.

BRIEF DESCRIPTION OF THE DRAWING FIGURES

A preferred embodiment of the present invention is described in detail below with reference to the attached drawing figures, wherein.

DETAILED DESCRIPTION OF A PREFERRED EMBODIMENT

Figure 1:
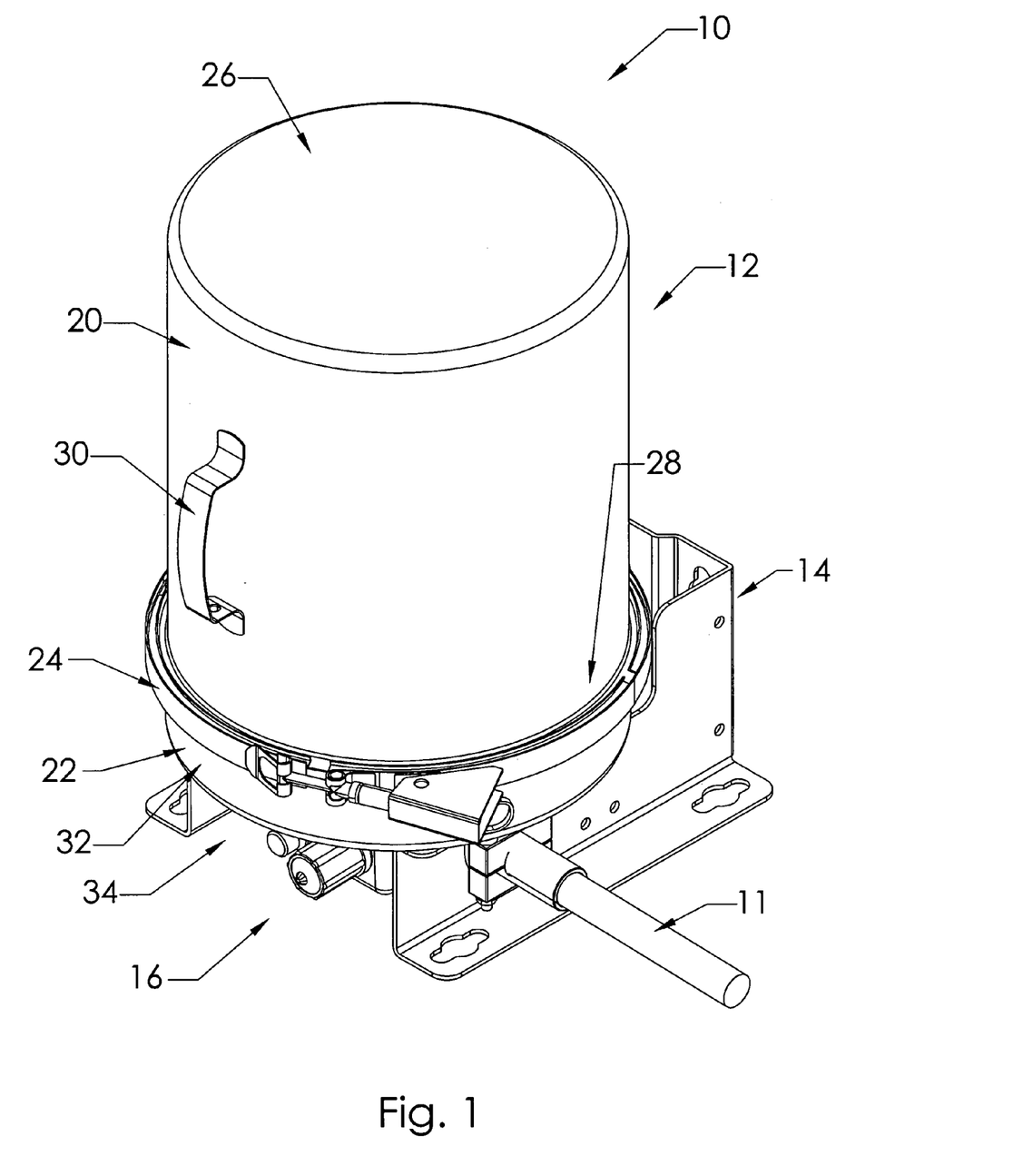
FIG. 1 is an isometric view of a preferred embodiment of the modular electronic equipment enclosure of the present invention.
Figure 2:
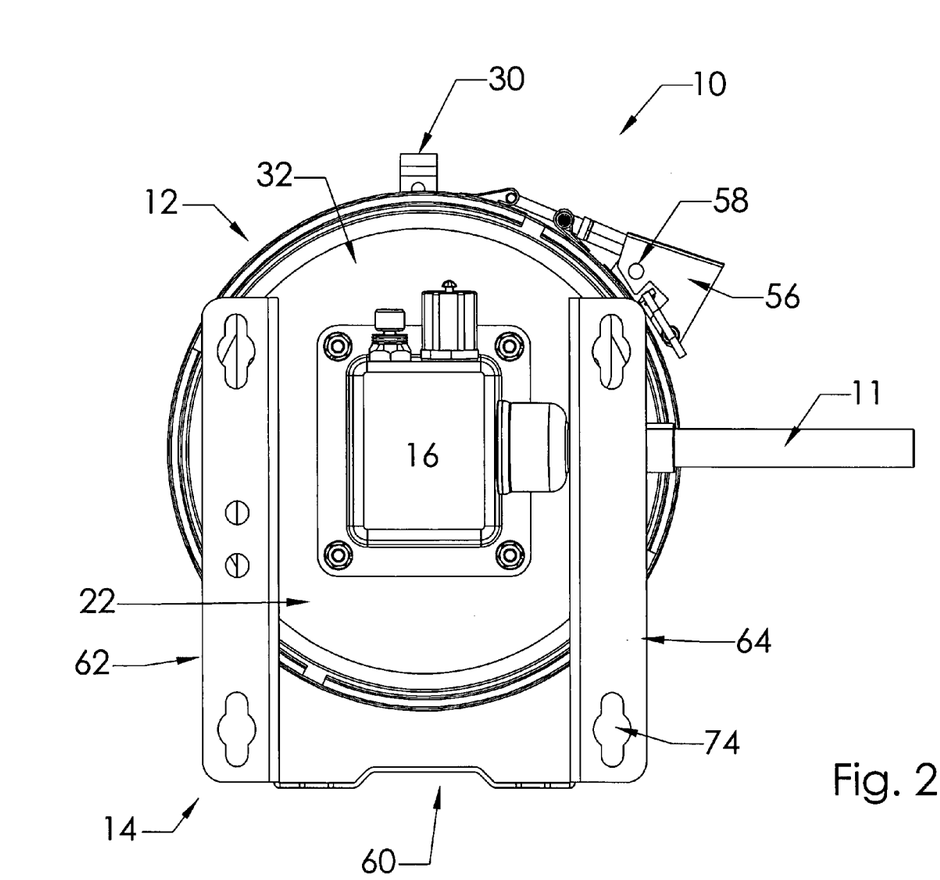
FIG. 2 is a bottom plan view of the embodiment shown in FIG. 1.
Figure 3:
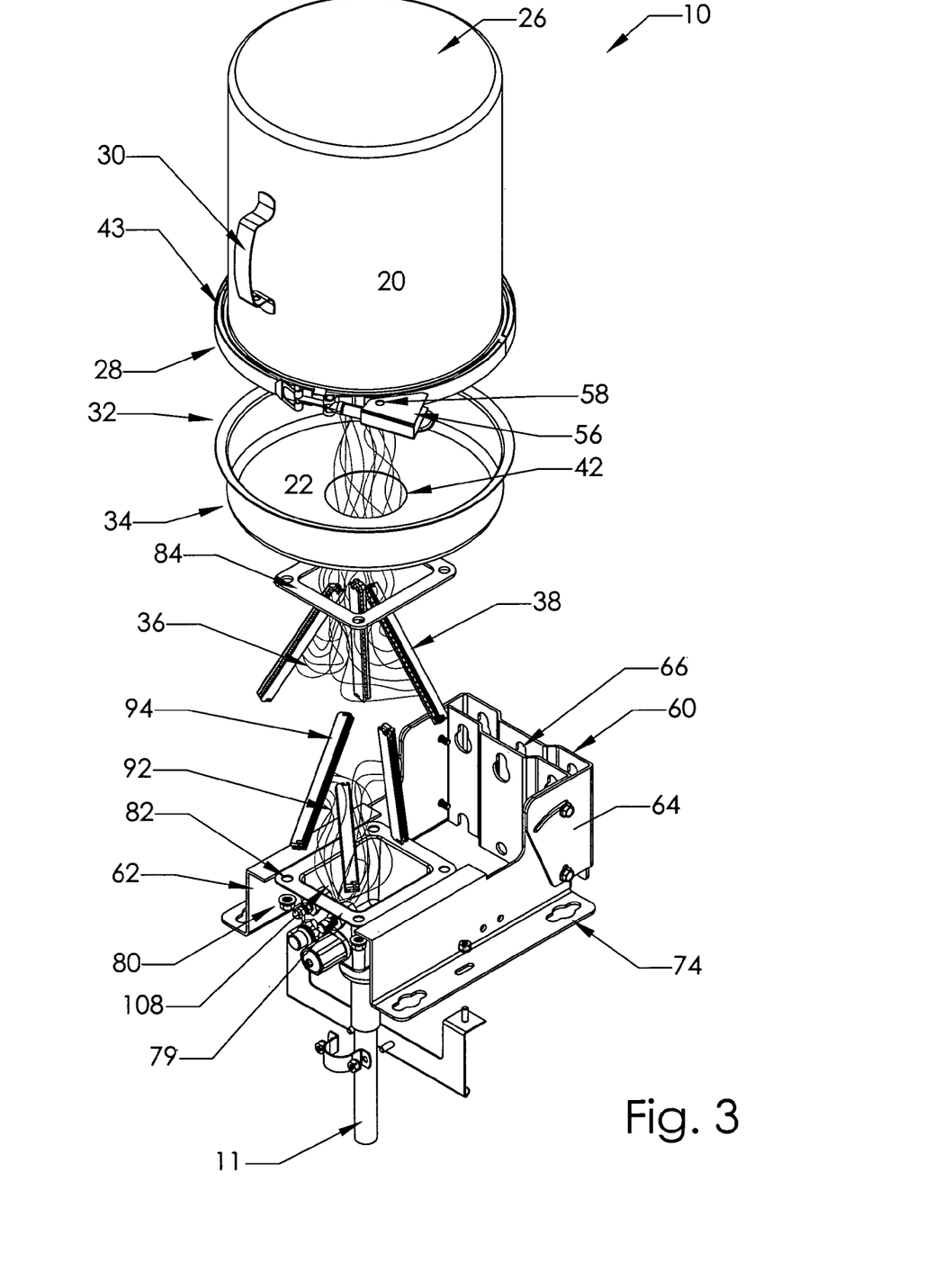
FIG. 3 is an exploded isometric view of the embodiment shown in FIG. 1.

Referring to FIGS. 1, 2, and 3, a modular electronic equipment enclosure 10 is shown constructed in accordance with a preferred embodiment of the present invention, and operable to house telecommunications, signaling, and similar electronic equipment, including, for example, repeater and doubler cards. The preferred enclosure 10 may be disassembled into a plurality of manageable modules to facilitate easier lifting or lowering, positioning, and mounting in a mounting location, and thereafter reassembled and interfaced with a cable assembly 11 to complete installation. The preferred modular enclosure 10 broadly comprises a housing module 12; a mounting structure 14; and a cable interface module 16.

The housing module 12 protectively houses the electronic equipment from physical damage and exposure to natural elements, including moisture, dust, and debris, and also provides for the dissipation of excess heat generated by the operating electronics. It will be appreciated by those with ordinary skill in the art, that the present invention is independent of any particular shape or construction of the housing module 12, which may be specially adapted for a particular operating environment or a particular requirement of the electronic equipment. Thus, the housing module 12 is not limited to the substantially cylindrical shape shown for illustrative purposes only, and may alternatively be rectangular, hexagonal, octagonal, or any other suitable shape, and may be constructed from any suitable material, including, for example, aluminum, stainless steel, plastic, fiberglass, or carbon fiber.

The housing module 12 broadly includes a first body portion 20; a second body portion 22; and a ring clamp 24. The first body portion 20 receives and retains most or all of the electronic equipment as well as any associated support equipment, such as, for example, heat dissipation components. The first body portion 20 is an elongated cylinder having exterior and interior surfaces, a closed top 26 and an open bottom 28. One or more handles 30 or similar structures may be secured to or incorporated into the exterior surface to facilitate easier handling during movement and installation. A periphery of the open bottom 28 presents an outwardly projecting first lip or flange 43.

A plurality of wires, which taken together form a first wire bundle 36, carry signals to and from the electronic equipment. Each wire connects at one end to the electrical equipment within the first body portion 20, and at another end to one or more male wire connector halves 38.

The second body portion 22 cooperates with the first body portion 20 to completely enclose the electronic equipment when assembled. The second body portion 22 is a cylindrical pan or lid having exterior and interior surfaces, an open top 32 and a substantially closed bottom 34. The substantially closed bottom 34 presents an opening 42 wherethrough wires may pass between the housing and interface modules 12,16. A periphery of the open top 32 of the second body portion 22 presents an outwardly projecting second lip or flange 44 corresponding in size and shape to the lip or flange 43 presented by the open bottom 28 of the first body portion 20.

Figure 4:
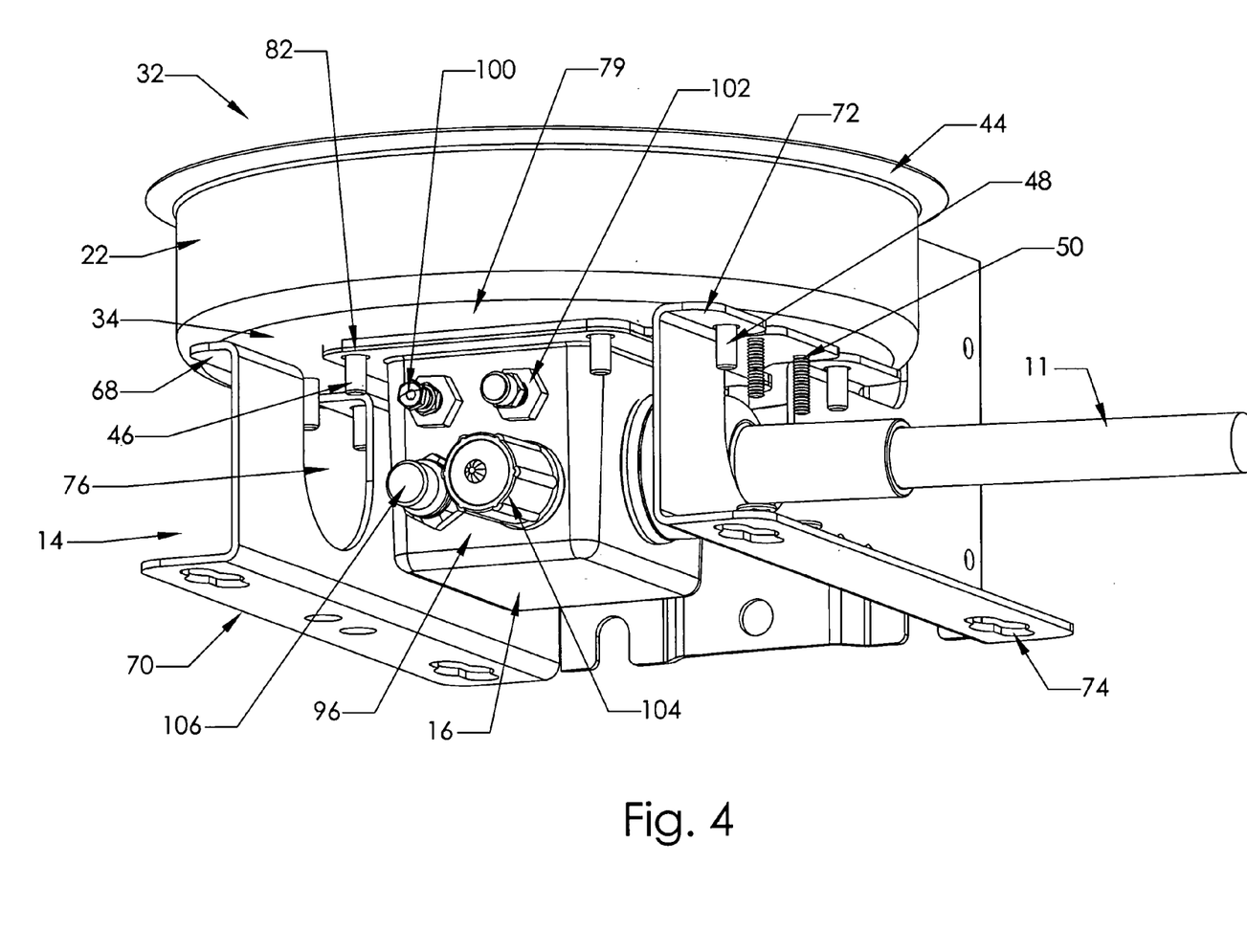
FIG. 4 is an isometric view of a bottom portion of the embodiment shown in FIG. 1.

Referring also to FIG. 4, the bottom 34 of the second body portion 22 also presents first and second sets of threaded studs 46,48. The first set of studs 46 is symmetrically spaced about the opening 42 and welded or otherwise secured to the bottom 34 and projecting downwardly therefrom to couple with the interface module 16. The second set of threaded studs 48 is also welded or otherwise secured to the bottom 34 and projecting downwardly therefrom to couple with the mounting structure.

The ring clamp 24 is conventionally operable to couple and secure the first and second body portions 20,22 by bringing and holding together in a clamped relationship the first and second lips or flanges 43,44 to form the assembled housing module 12. The ring clamp 24 is conventionally releaseable so that the body portions 20,22 may be separated when desired, such as, for example, when performing maintenance or removing or upgrading the electronic equipment. The ring clamp 24 may provide a locking mechanism 56, possibly including a hole 58 for receiving a conventional padlock (not shown), whereby unauthorized or inadvertent release or removal of the ring clamp 24 can be prevented.

The mounting structure 14 provides a means by which the housing module 12 may be secured to a mounting surface, such as a telephone pole or a concrete wall within a manhole. The mounting structure 14 is preferably constructed of a suitably strong and corrosion-resistant material, such as stainless steel, and broadly includes a back 60; a left bracket 62; and a right bracket 64. The back 60 provides mounting holes 66 for passing threaded bolts for securing the mounting structure to a vertical surface. The left and right brackets 62,64 are attached to the back and extend perpendicularly therefrom and parallel to each other. Each bracket 62,64 includes top and bottom flanges 68,70, with the top flange 68 providing mounting holes 72 for bolting the mounting structure 14 to the housing module 12 using the second set of threaded studs 48, and the bottom flange 70 providing mounting holes 74 for passing threaded bolts for securing the mounting structure to a vertical surface with the enclosure 10 oriented horizontally. The left and right brackets 62,64 also provide cutouts or holes 76 for allowing the cable assembly 11 to pass therethrough to the interface module 16.

Figure 5:
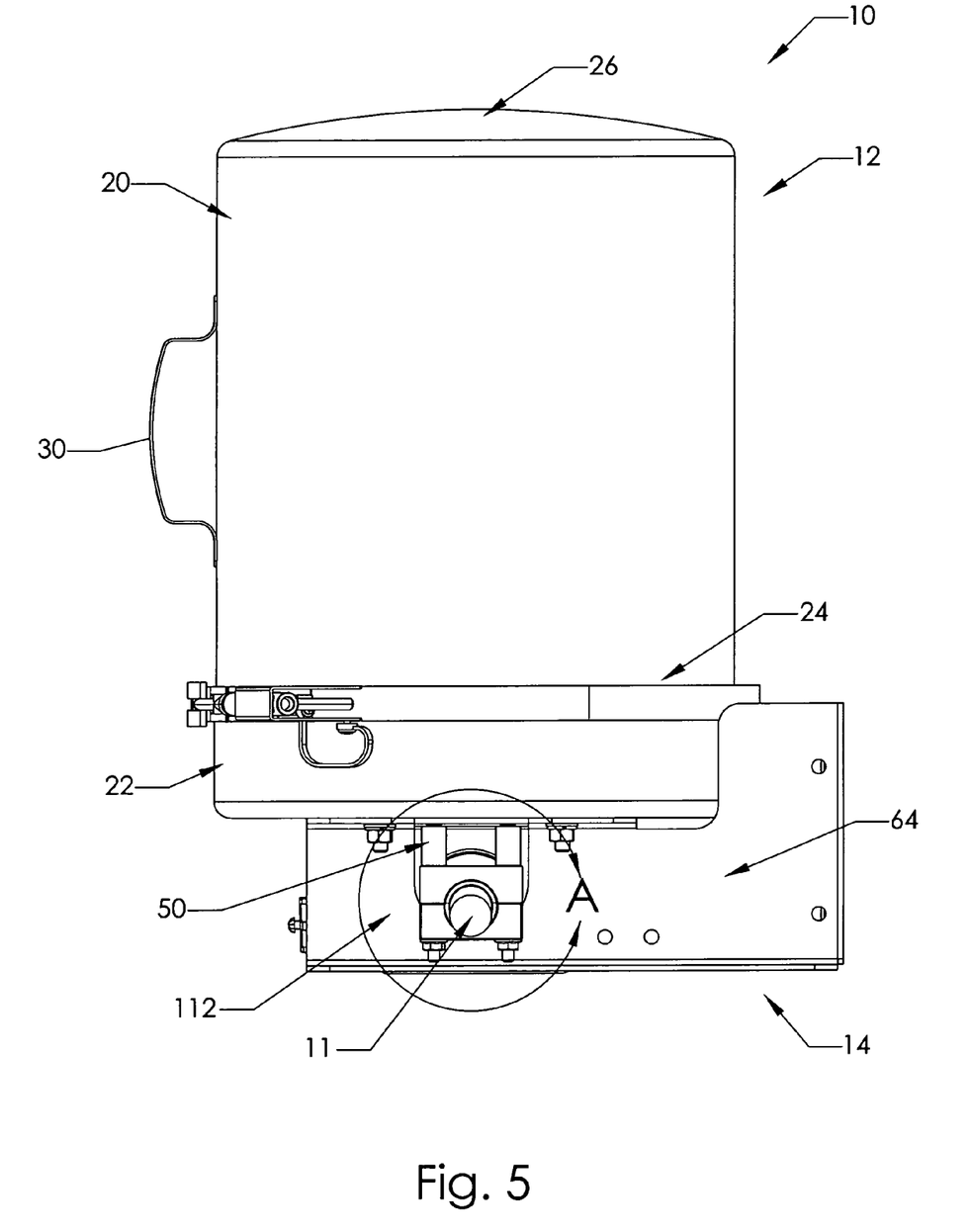
FIG. 5 is a right side elevational view of the embodiment shown in FIG. 1.
Figure 6:
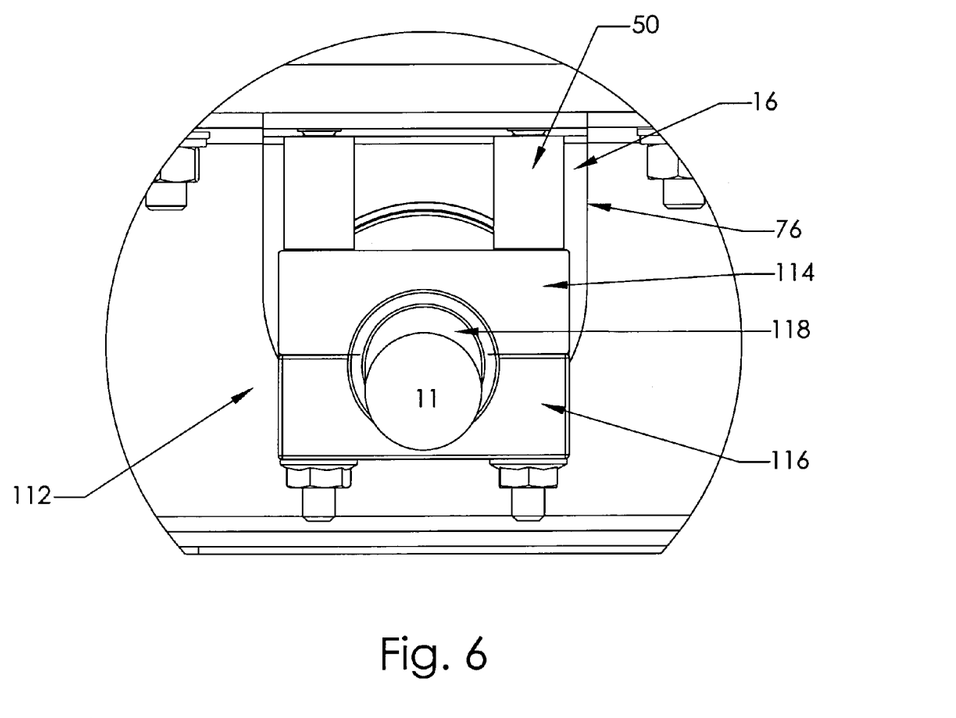
FIG. 6 is a fragmentary right side elevational view of a strain relief yoke of the preferred modular electronic equipment enclosure.

Referring to FIGS. 5 and 6, a strain relief yoke 112 is included to help support the cable assembly 11 and relieve strain thereon, particularly during rough handle or movement of the enclosure 10, support being otherwise provided only by the cable's connection with the interface module 16. The strain relief yoke 112 comprises separable upper and lower portions 114,116, with the upper portion 114 being securable to a set of threaded studs 50 welded or otherwise attached to and projecting downwardly from the lip or flange 68 of the left and right brackets 62,64. Each portion 114,116 provides half of a circular opening 118 corresponding substantially to the radius of the cable assembly 11. In use, the upper portion of the yoke 114 is secured to the threaded studs 50 of the left or right bracket 62,64, as appropriate, the cable assembly 11 is positioned in the opening 118, and the lower portion of the yoke 116 is coupled with the upper portion 114, thereby trapping and clamping the cable assembly 11 within the opening 118.

The interface module facilitates electrically interfacing the enclosure 10 with the cable assembly 11 operable to carry signals and air to and from the enclosure 10. The interface block 16 is shown substantially square, having a top 79, a bottom, and four sides, though any other alternatively suitable orthogonal or rounded shape may be used. The top 79 provides an opening 80 corresponding to the opening 42 provided in the bottom 34 of the second body portion 22; the openings 42,80 allow wires to pass between the housing 12 and interface module 16. The top also provides mounting holes 82 for passing the first set of threaded studs 46 projecting from the bottom 34 of the second body portion 22, thereby allowing the interface module 16 to be removably secured thereto with hex nuts, wing nuts, or other suitable fasteners. An O-ring or gasket 84 is used to ensure an adequate seal between the housing 12 and interface module 16, thereby preventing moisture, dust or debris from entering.

The cable assembly 11 enters a first side of the interface module 16 whereafter the cable separates into a plurality of wires forming a second wire bundle 92 which end in a plurality of female wire connectors 94 corresponding and connectable to the male wire connectors 38 described above. Once assembled, an electrical signal path is provided from the trunk line to the cable assembly 11, to the second wire bundle 92, to the female wire connectors 94, to the male wire connectors 38, to the first wire bundle 36, and finally to the electronic equipment.

A second side of the interface module 16 provides controls 96, including an air stem 100; a pressure relief valve 102; an order wire connection 104; and a pressure cutoff valve 106. The housing module 12 can be pressurized either through the pressure cutoff valve 106 or through the air stem 100. An air line extends between the cable assembly 11 and the cutoff valve 106 which, in an open position, allows air to flow into the housing module 12. The air stem 100 is coupleable with an air hose for receiving pressurized air into the sealed interface and housing modules 16,12. Positively pressurizing the sealed interior of the enclosure 10 aids in keeping out moisture and dust. The pressure relief valve 102 relives pressure when pressure exceeds a preset limit, and allows the sealed interior of the enclosure 10 to be depressurized, which, for safety reasons, is necessary prior to opening the enclosure 10, such as, for example, when repairing or replacing electronic equipment therein. The order wire connection 104 provides a means for accessing the services of the operating electronic equipment. For example, where the electronic equipment is telecommunications equipment, a technician can connect a field telephone to the order wire connection 104 and access the operating equipment to place a telephone call. The pressure cutoff valve 106 seals the pressurized interior of the enclosure 10 from the cable assembly 11. The pressure cutoff valve 106 is activated to stop air flow prior to opening the housing module 12 for maintenance purposes.

Preferably, the interior of the interface module 16 is substantially filled or potted with a sealing compound 108 to prevent air pressure from escaping and to prevent moisture and dust from entering.

As noted, the first set of threaded studs 46 projecting from the second body portion 22 are symmetrically spaced about the opening 42 in the bottom of the second body portion 22. This advantageously allows the interface module 16 to be secured thereto in any of a number of possible orientations, which allows the installing technician to attach the interface module 16 in the most convenient or otherwise desirable orientation given the operating environment and the location of the trunk line into which the cable assembly 11 must be spliced. In FIG. 4, for example, the cable assembly is shown exiting the interface module 16 to the right. However, the interface module 16 could be unbolted, rotated appropriately, and reattached so that the cable assembly 11 exited to the left, front, or rear.

In operation, a technician tasked with installing the enclosure 10 would first, having transported the assembled enclosure 10 to the mounting location, disassemble it into a number of more manageable modules, including the housing module 12, mounting structure 14, and cable interface module 16. The mounting structure 14 is then raised up onto the telephone pole or lowered into the manhole, as the case may be, and secured in either a vertical orientation by its back 60 or in a horizontal orientation by its left and right brackets 62,64.

The housing module 12 is then coupled with the mounting structure 14 as a unit with the first wire bundle 36 exiting the housing 12 from the opening 42 in the bottom of the second housing portion 22. Alternatively, to further enhance manageability, the first and second body portions 20,22 may be separated and the second body portion 22 secured to the mounting structure 16. The first body portion 20 may then be coupled with the mounted second body portion 22 using the ring clamp 24.

The female wire connector halves 94 of the interface module 16 are then connected to the corresponding male wire connector halves 38 of the housing 12, and the interface module 16 itself coupled with the bottom of the second housing portion 22, preferably using the O-ring or gasket 84 to avoid leakage. As noted, the interface module 16 may be rotated to affect the most advantageous orientation, preferably one in substantial alignment with the trunk line into which the cable assembly 11 must be spliced.

The strain relief yoke is then attached, as described above, to trap and clamp the cable assembly 11 and provide additional support and strain relief. The housing module 12 is then positively pressurized using either an air hose attached to the air stem 100 or by opening the cutoff valve 106.

It will be appreciated by those with skill in the art that the order of reassembling the enclosure 10 may be varied as desired. For example, in certain situations, it may be desirable to couple the interface module 16 with the mounted second body portion 22 prior to attaching the first body portion 20. The present invention is not concerned with the order of reassembly.

Furthermore, the modularity of the enclosure 10 allows the installation process to be broken into particular tasks, wherein each task is performed by a different technician or team of technicians having specialized equipment or training. For example, in some situations it may be desirable that a first technician mounts one or more of the mounting structures 14; at some time thereafter a second technician couples the housing module 12 to the mounted mounting structure 14, and couples the interface module 16 with the cable assembly 11; and at some later time a third technician splices the cable assembly 11 into the trunk line.

Although the invention has been described with reference to the preferred embodiment illustrated in the attached drawing figures, it is noted that equivalents may be employed and substitutions made herein without departing from the scope of the invention as recited in the claims. For example, as noted above, the present invention is independent of the shape or construction of the housing module 12, and of the various controls 96 provided by the interface module 16. Furthermore, the enclosure 10 may be used to house a variety of electronic equipment, including, for example, telecommunications repeater or doubler cards or signaling equipment, such as might be used for controlling traffic signals.

Having thus described the preferred embodiment of the invention, what is claimed as new and desired to be protected by Letters Patent includes the following:

1. A modular enclosure for housing, mounting, and interfacing electronic equipment, the modular enclosure comprising:
   a housing module for protectively housing the electronic equipment;
   a mounting structure separably coupled with the housing and secureable to a mounting surface; and
   an interface module separably coupled with the housing and including a first wire connector half operable to couple with a corresponding second wire connector half connected to the electronic equipment, wherein the interface module may be coupled with the housing in any one of two or more possible orientations.

2. The modular enclosure as set forth in claim 1, wherein the electronic equipment is telecommunications equipment.

3. The modular enclosure as set forth in claim 1, wherein the electronic equipment is signaling equipment.

4. The modular enclosure as set forth in claim 1, wherein the housing module includes—
   a first body portion operable to receive and retain the electronic equipment; and
   a second body portion operable to cooperate with the first body portion to substantially enclose the electronic equipment,
   wherein the housing module provides a set of symmetrically-spaced threaded studs for separably coupling the housing module with the interface module.

5. The modular enclosure as set forth in claim 1, wherein the housing module includes one or more handles to facilitate handling.

6. The modular enclosure as set forth in claim 1, wherein the mounting structure is operable to secure to a mounting surface and to provide the housing module with an operating orientation which is perpendicular to the mounting surface.

7. A modular enclosure for housing, mounting, and interfacing electronic equipment, the modular enclosure comprising:
   a housing module for protectively housing the electronic equipment;
   a mounting structure separably coupled with the housing and securable to a mounting surface, the mounting structure including a strain relief yolk operable to support a cable assembly; and
   an interface module separably coupled with the housing and including a first wire connector half operable to couple with a corresponding second wire connector half connected to the electronic equipment.

8. A modular enclosure for housing, mounting, and interfacing electronic equipment, the modular enclosure comprising:
   a housing module for protectively housing the electronic equipment;
   a mounting structure separably coupled with the housing and securable to a mounting surface; and
   an interface module separably coupled with the housing and including a first wire connector half operable to couple with a corresponding second wire connector half connected to the electronic equipment, wherein an interior portion of the interface module is filled with a sealing compound.

9. A modular enclosure for housing, mounting, and interfacing electronic telecommunications equipment, the modular enclosure comprising:
   a housing module for protectively housing the electronic telecommunications equipment;
   a mounting structure separably coupled with the housing and securable to a mounting surface, the mounting structure including a strain relief yolk operable to support a cable assembly; and
   an interface module separably coupled with the housing and including a first wire connector half operable to couple with a corresponding second wire connector half connected to the electronic telecommunications equipment, with an interior portion of the interface module being filled with a sealing compound, wherein the interface module may be coupled with the housing in any one of two or more possible orientations.

10. A modular enclosure for housing, mounting, and interfacing electronic equipment, the modular enclosure comprising:
    a housing module for protectively housing the electronic equipment, the housing module including—
      a first body portion for receiving and retaining the electronic equipment, and
      a second body portion operable to cooperate with the first body portion to substantially enclose the electronic equipment;
    a mounting structure separably coupled with the housing and operable to secure to a mounting surface; and
    an interface module separably coupleable with the housing in any of two or more possible orientations.

11. The modular enclosure as set forth in claim 10, wherein the electronic equipment is telecommunications equipment.

12. The modular enclosure as set forth in claim 10, wherein the electronic equipment is signaling equipment.

13. The modular enclosure as set forth in claim 10, wherein the housing module includes one or more handles to facilitate handling.

14. The modular enclosure as set forth in claim 10, wherein the mounting structure includes a strain relief yolk operable to support the cable assembly.

15. The modular enclosure as set forth in claim 10, wherein an interior portion of the interface module is filled with a sealing compound.

16. A modular enclosure for housing, mounting, and interfacing electronic signaling equipment, the modular enclosure comprising:

a housing module for protectively housing the electronic signaling equipment;

a mounting structure separably coupled with the housing and securable to a mounting surface, the mounting structure including a strain relief yolk operable to support a cable assembly; and an interface module separably coupled with the housing and including a first wire connector half operable to couple with a corresponding second wire connector half connected to the electronic signaling equipment, with an interior portion of the interface module being filled with a sealing compound, wherein the interface module may be coupled with the housing in any one of two or more possible orientations.

\* \* \* \* \*